(12) United States Patent
Narayanan et al.

(10) Patent No.: US 10,103,626 B1
(45) Date of Patent: Oct. 16, 2018

(54) DIGITAL POWER MULTIPLEXOR

(71) Applicant: QUALCOMM Incorporated, San Diego, CA (US)

(72) Inventors: Venkatasubramanian Narayanan, San Diego, CA (US); Dorav Kumar, San Diego, CA (US); Ramaprasath Vilangudipitchai, San Diego, CA (US); Venugopal Boynapalli, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/647,326

(22) Filed: Jul. 12, 2017

(51) Int. Cl.
*H02M 3/157* (2006.01)
*H03K 17/687* (2006.01)
*H03K 19/173* (2006.01)
*H02M 3/335* (2006.01)

(52) U.S. Cl.
CPC ....... *H02M 3/157* (2013.01); *H02M 3/33515* (2013.01); *H03K 17/687* (2013.01); *H03K 19/173* (2013.01); *H03K 2217/0036* (2013.01)

(58) Field of Classification Search
CPC .................................................... H02M 3/157

USPC .......................................................... 375/142
See application file for complete search history.

(56) References Cited

U.S. PATENT DOCUMENTS

| 6,894,472 B2 | 5/2005 | Chen |
| 7,005,911 B1 | 2/2006 | Om'mani |
| 9,450,580 B2 | 9/2016 | Lundberg et al. |
| 2002/0097237 A1* | 7/2002 | Tomio ................ G09G 3/2927 345/211 |
| 2005/0040802 A1* | 2/2005 | Chen ..................... G05F 1/575 323/312 |
| 2016/0070323 A1 | 3/2016 | Patil et al. |
| 2017/0033796 A1 | 2/2017 | Cao et al. |

* cited by examiner

*Primary Examiner* — Lihong Yu
(74) *Attorney, Agent, or Firm* — Haynes and Boone, LLP

(57) ABSTRACT

A power multiplexor includes: a first branch including a first transistor coupled in series with a second transistor between a first power supply and a power output; a second branch including a third transistor coupled in series with a fourth transistor between a second power supply and the power output; a controller configured to selectively assert and de-assert a control signal to the first branch and the second branch; a first voltage level shifter coupled between the second transistor and the controller; and a second voltage level shifter coupled between the third transistor and the controller.

18 Claims, 5 Drawing Sheets

DIGITAL POWER MULTIPLEXOR

TECHNICAL FIELD

The present application relates, generally, to power multiplexors and, more specifically, to digital power multiplexors.

BACKGROUND

A conventional computing device (e.g., smart phone, tablet computer, etc.) may include a system on chip (SOC), which has a processor and other operational circuits. The SOC may receive its power from a battery, and thus conventional designs may balance SOC performance and power usage to deliver a desirable experience to the user while requiring as little battery charging as practicable.

Some conventional SOC designs include multiple power domains receiving power from one or more power supplies. Power multiplexing may be used in some conventional systems to reduce power consumption during normal operation of a computing device. For instance, a power multiplexor may include a multiplexor that receives at its inputs multiple (e.g., two) power inputs and has a power output, and the power multiplexor selects between the power inputs. And a given SOC design may include a multitude of different power multiplexors to provide power to different processing units in the SOC.

One way in which some conventional systems may use power multiplexing to save power is to enable a power collapse of some parts of a processing core (using a first power multiplexor and a first power domain) while providing power to parts of the processing core that store state values (using a second power multiplexor and a second power domain). Both the first and second power multiplexors may select between the first and second power domains. Another way in which some conventional systems may use power multiplexing is to switch from a first power supply to a second power supply to power a central processing unit (CPU) memory and then adjusting the second power supply to overdrive the CPU memory. This technique may save power by allowing the SOC to selectively raise a voltage at some components while not raising the voltage at other components.

Thus, a power multiplexor (or power mux) may be used to switch cores between two or more power supplies, depending on operating mode. A conventional power multiplexor may include a mixed signal design, employing analog components (e.g., a VDD comparator) to detect the higher of two supplies and an analog voltage generator that generates the higher of the two (or multiple) voltages that are being switched to an internal supply. The analog circuitry, such as the comparator and voltage generator, may be complex and use an undesirably large amount of circuit space. Accordingly, there is a need in the art for power multiplexor designs that omit analog comparators and voltage generators.

Such conventional power multiplexors may use head switches having a single transistor each. The conventional power multiplexor may operate under the assumption that only one side is active at any given time, allowing switching between power domains. However, if a transistor used in one of the head switches is not fully turned off, it may allow leakage between the power domains, which may be undesirable. Accordingly, there is a need in the art for a more reliable power multiplexor.

SUMMARY

Various embodiments provide a digital power multiplexor having at least a first branch and a second branch, each of the first and second branches including two or more transistors. At least two of the transistors in a given branch are controlled by different voltages to turn off the transistors in a branch that is intended to be off. Accordingly, various embodiments may reduce or eliminate the possibility of undesirable leakage from one power domain to another. Furthermore, various embodiments may use digital components in place of some analog components, thereby reducing complexity and circuit space.

According to one embodiment, a power multiplexor includes: a first branch including a first transistor coupled in series with a second transistor between a first power supply and a power output; a second branch including a third transistor coupled in series with a fourth transistor between a second power supply and the power output; a controller configured to selectively assert and de-assert a control signal to the first branch and the second branch; a first voltage level shifter coupled between the second transistor and the controller; and a second voltage level shifter coupled between the third transistor and the controller.

According to another embodiment, a method includes: asserting a control signal to a first branch of a power multiplexor, the first branch including a first transistor and a second transistor coupled between a first power supply and a power output, wherein the control signal is applied to a gate of the first transistor and applied to a level shifter at a gate of the second transistor; de-asserting the control signal to a second branch of the power multiplexor, the second branch including a third transistor and a fourth transistor coupled between a second power supply and the power output; and conducting current from the second power supply to the power output after de-asserting the control signal to the second branch.

According to another embodiment, a digital power multiplexor includes: means for conducting current from a first power supply, the means for conducting current from the first power supply including a first transistor and a second transistor coupled in series between the first power supply and a power output; means for conducting current from a second power supply, the means for conducting current from the second power supply including a third transistor and a fourth transistor coupled in series between the second power supply and the power output; and means for selecting either the first power supply or the second power supply at a given time and not selecting the other of the first power supply or the second power supply at the given time, the means for selecting including control signal outputs to the first and fourth transistors and control signal outputs to voltage level shifters at the second and third transistors.

DETAILED DESCRIPTION

Figure 1:
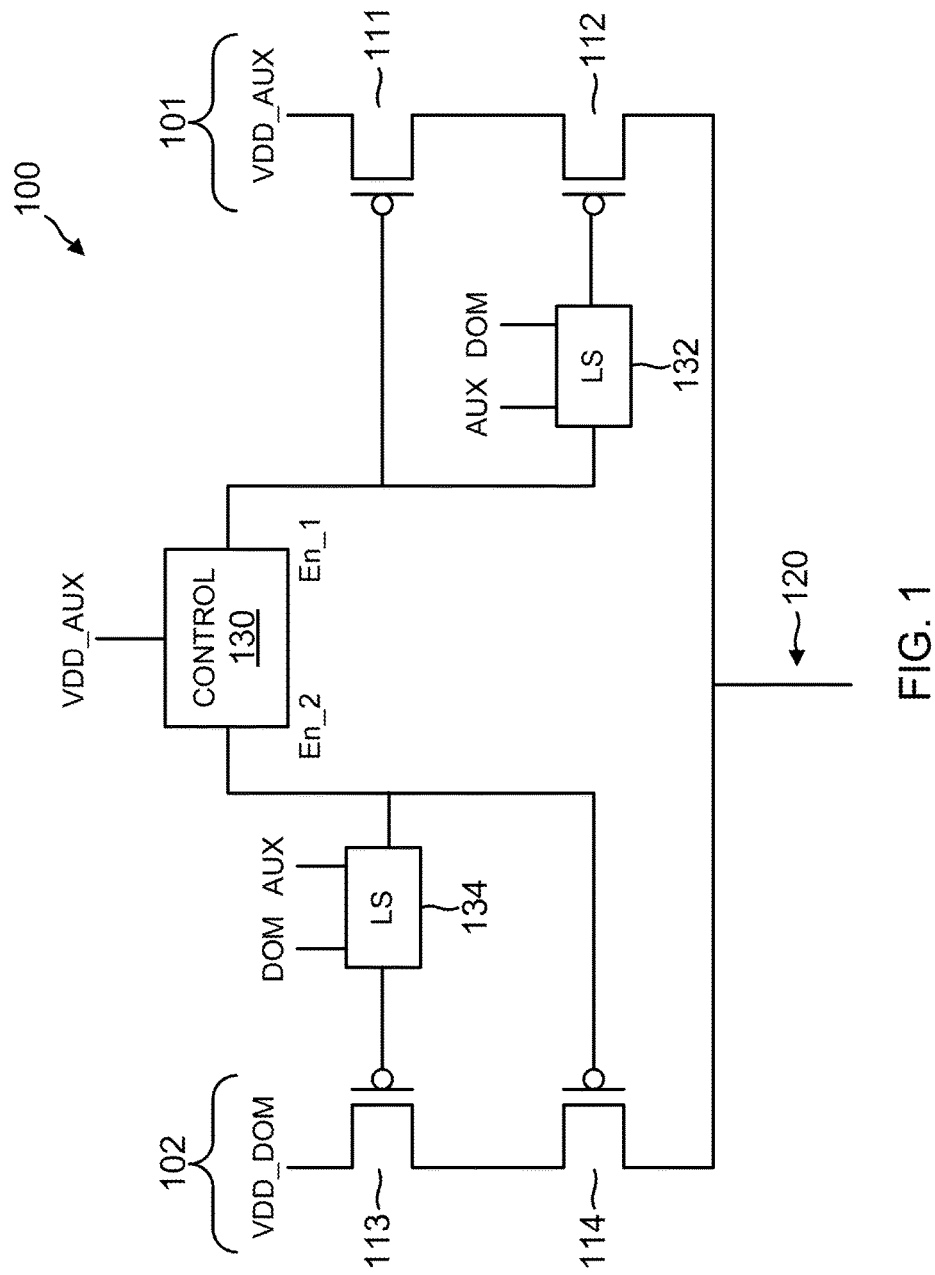
FIG. 1 is an illustration of an example power multiplexor, according to various embodiments.

Various embodiments provided herein include systems and methods to distribute power using a digital power multiplexor. The digital power multiplexor includes at least two branches, each of the branches having at least two transistors in series between a respective power supply and a power output. Additionally, a voltage level shifter may be used at each branch at a gate of at least one of the transistors. Therefore, at each branch, there is at least one transistor that receives a control signal at a first voltage and another transistor that receives a level shifted control signal. In other words, two transistors in each branch are controlled by different voltages. As explained further below, this architecture may help to ensure that a given branch is turned off when the other power supply is being used to supply current to the power output.

In one embodiment, a computer processor includes a number of integrated circuit chips (e.g., a SOC that has a number of processing cores, a power management integrated circuit (PMIC), and the like). The chips are disposed within a computing device, such as a smart phone. The computing device also includes a battery, a printed circuit board hosting the chips, a touchscreen display, and an outer housing, among other things. A power supply, e.g., the PMIC, converts the voltage and current from the battery into a voltage and current that can be used by the other chips.

Continuing with the example, the PMIC may be coupled with a first power domain. The computer processor may include other power domains as well, and those other power domains may be used to provide power at different voltages, readily collapsible power, and the like. Throughout the computer processor, there may be a multitude of power multiplexors, wherein each of those power multiplexors may receive power from two or more power domains and select between those two or more power domains. For instance, each processing core in an SOC may have its own power multiplexor so that the core may be power collapsed or provided a higher or lower voltage at a given time. In fact, any particular component may receive its power via a power multiplexor, thereby allowing power domains to be selected and/or adjusted as appropriate for a given goal.

In one example, a particular power multiplexor may include a first branch for conducting current from a first power supply. The first branch may include a first transistor and a second transistor coupled in series between the first power supply and a power output. The example power multiplexor also may include a second branch for conducting current from a second power supply. The second branch may include two more transistors—a third transistor and a fourth transistor—coupled in series between the second power supply and the power output. In this example, the transistors include P-type metal oxide semiconductor (PMOS) transistors, which may be turned off by a gate voltage that is higher than or equal to a source or a drain voltage.

The power multiplexor also may include a power multiplexor controller for selecting either the first power supply or the second power supply at a given time and de-selecting the other power supply. The power multiplexor controller has control signal outputs to the first branch and the second branch, allowing the power multiplexor controller to selectively assert a control signal to one of the branches and selectively de-assert the control signal to the other of the branches.

Continuing with this example, the power multiplexor controller may turn off the first branch, thereby de-selecting the first power supply, by asserting the control signal to the first branch. One of the transistors of the first branch receives the control signal at a first voltage (e.g., a voltage associated with the first power supply), and the other one of the transistors of the first branch receives the asserted control signal through a voltage level shifter that shifts the voltage from the first voltage to a second voltage (e.g., a voltage associated with the second power supply). In an example in which the second voltage is higher than the first voltage, applying the second voltage to a gate of the second transistor helps to ensure that the second transistor is turned off, even when a source or drain in the second transistor may be at the second voltage itself.

Further in this example, the power multiplexor controller turns on either one or the other branch at a particular time. Thus, the power multiplexor controller may turn on the second branch, thereby selecting the second power supply. The power multiplexor controller may turn on the second branch in this example by de-asserting the control signal to the third and fourth transistors. When the second branch is on, the second power supply conducts current to the power output.

The power multiplexor controller may select the first power supply by de-asserting the control signal to the first branch and asserting the control signal to the second branch. Once again, one of the transistors (e.g., the third transistor) of the second branch receives the asserted control signal through a voltage level shifter while the other of the transistors (e.g., the fourth transistor) receives the asserted control signal without level shifting. The higher voltage at the gate of the third transistor helps to ensure that the third transistor is turned off and does not allow current flow from the second power supply. By contrast, de-assertion of the control signal to the first branch turns on the transistors of the first branch, thereby allowing current to be conducted from the first power supply to the power output. In this manner, a CPU or other logic device in a chip may select a power supply at a given power multiplexor by causing the controller to assert a control signal to one branch of the power multiplexor while de-asserting the control signal to the other branch of the power multiplexor. In another embodiment, logic for selecting a power supply may be embedded in the power multiplexor controller itself.

FIG. 1 is a simplified diagram illustrating an example power multiplexor 100, according to one embodiment. The example power multiplexor 100 includes a first branch 101 with transistor 111 and transistor 112 coupled in series between a first power supply (VDD_AUX) and power output 120. Although not explicitly shown in FIG. 1, power output 120 may be coupled to, e.g., clock circuits, processing cores, sequential logic components within cores, and the like.

The example power multiplexor 100 also includes a second branch 102 with transistors 113, 114 coupled in series between a second power supply (VDD_DOM) and the power output 120. Further in this example, the first power supply VDD_AUX includes an "always on" power supply. Of course, it is possible that VDD_AUX may be turned off by for example removing a battery from the device. Nevertheless, VDD_AUX may include a power domain that is distributed to a multitude of different devices (not shown here) that use the power domain for a consistent voltage level and reliable access to that voltage during normal operation of the device. In various embodiments, VDD_AUX may provide a voltage that is varied by relatively small amounts to account for temperature of operation, aging of transistors, and other phenomena. Power multiplexor controller 130 is powered by VDD_AUX to take advantage of the consistent and reliable voltage.

VDD_DOM in this example is another power supply and may include yet another "always on" power supply or may include another type of power supply that may be expected to be turned on or off at various times or may be associated with a voltage that may be varied relatively substantially, e.g., for power saving or over-driving. Power multiplexor 100 allows for selection between VDD_AUX and VDD_DOM so that one or the other of those power supplies conducts current to power output 120.

The example power multiplexor 100 also includes power multiplexor controller 130, which may assert and de-assert control signals En_1 and En_2. Furthermore this example, the control signals En_1 and En_2 have a voltage level corresponding to that of VDD_AUX, at least when asserted. Looking at first branch 101, voltage level shifter 132 is coupled between the gate of transistor 112 and the power multiplexor controller 130. Similarly, level shifter 134 is coupled between the gate of transistor 113 and controller 130. When control signal En_1 is asserted, it has a voltage level corresponding to VDD_AUX, so that the voltage level of VDD_AUX is applied to the gate of transistor 111. Voltage level shifter 132 shifts a voltage level of En_1 to a voltage level corresponding to that of VDD_DOM, thereby applying the voltage level of VDD_DOM to the gate of transistor 112. When control signal En_1 is asserted, that turns off first branch 101. First branch 101 may be turned on by de-asserting control signal En_1, thereby applying 0 V or other appropriate low voltage to the gates of transistors 111, 112.

When control signal En_2 is asserted, a voltage level corresponding to that of VDD_AUX is applied to the gate of transistor 114. Level shifter 134 shifts the voltage of En_2 to that of VDD_DOM, thereby applying the voltage level of VDD_DOM to the gate of transistor 113. When control signal En_2 is asserted, this turns off second branch 102. De-asserting control signal En_2 turns on branch 102 by applying a low voltage, such as 0 V, to the gates of transistors 113, 114. Of course, in this particular example at any given time one of the control signals En_1 or En_2 would be asserted and the other would be de-asserted. For example, if En_1 is de-asserted, then En_2 would be asserted (and vice versa) to prevent a scenario wherein both branches 101, 102 are on at the same time. Some embodiments may also include turning both branches 101, 102 off at the same time to de-power downstream components.

Figure 2:
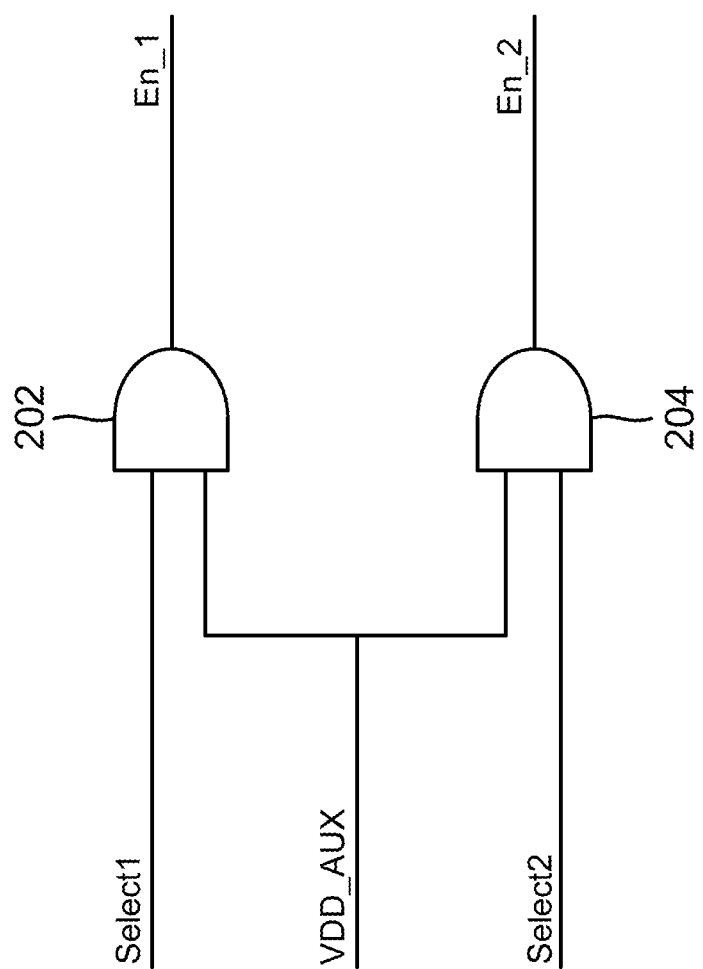
FIG. 2 is an illustration of an example internal architecture of the power multiplexor controller of FIG. 1, according to one embodiment.

Power multiplexor controller 130 may be implemented using any appropriate technique. For instance, power multiplexor controller 130 may include a computer processor that operates a state machine according to hardware, software, or combination thereof. Similarly, power multiplexor controller 130 may be implemented using a combination of digital logic gates. An example combination of digital logic gates is shown at FIG. 2, according to one embodiment. In the example of FIG. 2, two AND logic gates 202, 204 are combined as shown to output either En_1 or En_2, depending on which branch is selected. For example, if the signal Select1 corresponds to En_1, and if the signal Select2 corresponds to En_2, then asserting one or the other of Select1 or Select2 will assert En_1 or En_2 respectively, with the other one being de-asserted. In some examples, the Select1 and Select2 signals may be provided by a CPU or other component running a power management algorithm.

Various embodiments may scale the power multiplexor 100 as appropriate. For instance, while each branch 101, 102 shown having to transistors each, other embodiments may include three or more transistors in each branch. Similarly, each branch in FIG. 1 is associated with a particular power supply, so that the power multiplexor 100 as shown in FIG. 1 selects between two power supply options. However, other embodiments may include more than two branches to be able to select among three or more power supplies. For instance, the number of control signals may be increased so that each branch may be turned on or turned off individually to allow a selected power supply to conduct current to the power output while branches at the other power supplies are turned off.

Figure 3:
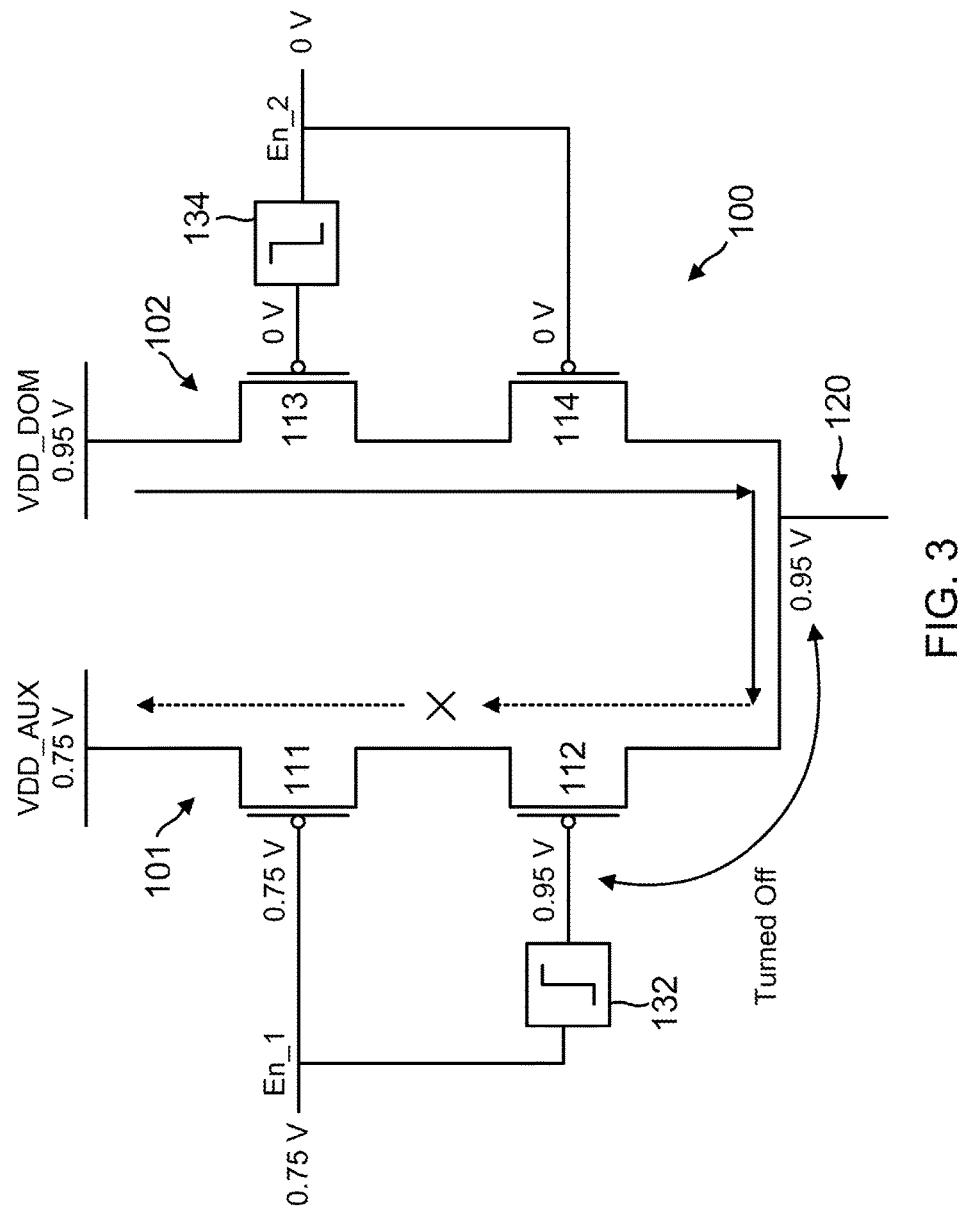
FIG. 3 is an illustration of the example power multiplexor of FIG. 1, illustrating one branch turned on and one branch turned off, according to one embodiment.

FIG. 3 is an illustration of a use case of example power multiplexor 100, according to one embodiment. While multiplexor controller 130 is not shown in FIG. 3, it is understood that control signals En_1, En_2 are provided by multiplexor controller 130. Furthermore, while the description of FIG. 3 uses specific voltage values, it is understood that various embodiments may use any appropriate voltage values and that the scope of embodiments is not limited to any particular set of voltage values.

Continuing with the example, VDD_AUX has a value of 0.75 V, whereas VDD_DOM has a value of 0.95 V. Accordingly, power multiplexor controller 130 (not shown) may be powered by 0.75 V, and the control signals En_1, En_2 may have a voltage level of 0.75 V when asserted and 0 V when de-asserted.

The example of FIG. 3 assumes that first branch 101 is turned off and that second branch 102 is turned on, thereby selecting the power supply VDD_DOM to conduct current to the power output 120. Since the first branch 101 is turned off, VDD_AUX is unselected.

When control signal En_1 is asserted, that applies 0.75 V to the gate of transistor 111. Level shifter 132 shifts the voltage value of the control signal En_1 to a value associated with a voltage level of VDD_DOM (0.95 V). Accordingly, 0.95 V is applied to the gate of transistor 112. Note that the source or drain of transistor 112 is at 0.95 V as well, and thus transistor 112 is turned off because its gate is at a voltage that is higher than or equal to its source/drain voltage. In fact, because the gate of transistor 112 is held at a voltage equal to or higher than VDD_DOM, this eliminates or minimizes any current flow through transistor 112 when branch 101 is turned off and branch 102 is turned on. In embodiments in which a value of VDD_DOM may vary, the level shifters 132, 134 may output a voltage associated with a highest expected value of VDD_DOM in order to ensure that transistor 112 (or transistor 113) is turned off when appropriate. Transistor 111 is also turned off because its gate is at a voltage that is higher than or equal to the voltage at its source or drain (0.75 V).

Looking at branch 102, the control signal En_2 is de-asserted and in this example is at 0 V, which causes 0 V to be applied to the gates of both transistors 113, 114. This turns branch 102 on and creates a current path from the power source VDD_DOM to the power output 120.

Similarly, branch 101 may be turned on and branch 102 may be turned off by de-asserting control signal En_1 and asserting control signal En_2. Although not shown in FIG. 3, such action would result in 0 V being applied at the gates of transistors 111, 112, thereby turning branch 101 on. Such action would also result in 0.95 V being applied at the gate of transistor 113 and 0.75 V being applied at the gate of transistor 114. Since transistor 113 would have its gate at a voltage higher than or equal to that of its source (0.95 V), transistor 113 would be turned off and eliminate or minimize any current flow through transistor 113. Transistor 114 would also be turned off because its gate would be held at 0.75 V, which is higher than or equal to the voltage at its source or drain.

Figure 4:
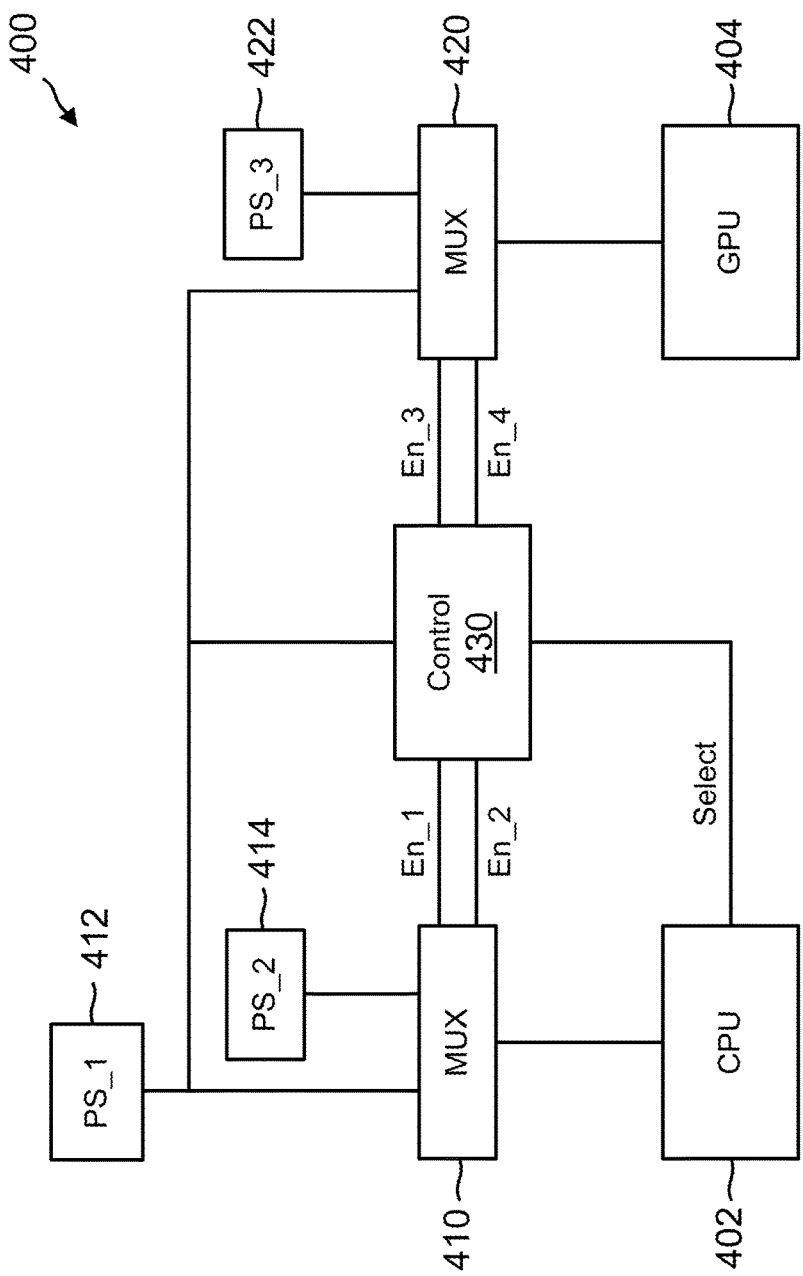
FIG. 4 is an illustration of an example portion of a computing device using more than two power supplies, multiple processing units, and multiple power multiplexors, according to one embodiment.

FIG. 4 is an illustration of example system 400, adapted according to one embodiment. As noted above, various computing systems may include a multitude of processing units. Thus, FIG. 4 includes two processing units—central processing unit (CPU) 402 and graphics processing unit (GPU) 404. The example of FIG. 4 illustrates a portion of a computing system, such as an SOC or other multiple-component computing system that may be implemented in any of a variety of devices, such as a smart phone, tablet computer, laptop computer, and the like.

FIG. 4 includes power multiplexor 410, which is coupled to CPU 402, and power multiplexor 420, which is coupled to GPU 404. The power multiplexors 410, 420 are controlled by power multiplexor controller 430, which outputs control signals En_1-En_4 as appropriate to select a given power supply at a given processing unit. In contrast to the illustration of FIG. 1, and which a single power multiplexor controller is associated with a single power multiplexor, the embodiment of FIG. 4 illustrates that the control functionality of a power multiplexor controller may be used to control a multitude of power multiplexors throughout a system. For instance, power multiplexor controller 430 may select either power supply 412 or power supply 414 by asserting one of control signals En_1 or En_2 and de-asserting the other control signal. This may cause power multiplexor 410 to conduct current from one of the power supplies 412, 414 to CPU 402 and to turn off a branch associated with the other one of the power supplies.

Similarly, power multiplexor controller 430 may select either a power supply 412 or 422 by asserting one of control signals En_3 or En_4 and de-asserting the other one of the control signals. This may cause power multiplexor 420 to conduct current from one of the power supplies 412, 422 to GPU 404 and to turn off a branch associated with the other one of the power supplies. Power multiplexor controller 430 in this example is controlled by CPU 402 via the Select signal, which causes power multiplexor controller 430 to assert or de-assert any of the En_X control signals as appropriate. Of course, the scope of embodiments is not limited to this specific control regime, as power multiplexor controller 430 may be controlled by any appropriate logic suitable to a particular application.

Each of the power multiplexors 410, 420 in the example of FIG. 4 may be implemented according to an architecture illustrated above with respect to FIGS. 1-3. Specifically, each of the power multiplexors 410, 420 may include two branches—one for each of its respective power supplies—and each of the branches having at least two transistors. Each branch may have one transistor controlled by a voltage from a level shifter and another transistor controlled by voltage of the respective control signal En_X.

Continuing with the example, the power supply 412 may be an "always on" power supply that provides a reliable and stable voltage, whereas power supplies 414, 422 may either be "always on" power supplies or not. For instance, one embodiment may implement power supply 412 using a PMIC that feeds a widely-used power domain, as illustrated by the power supply 412 providing power at multiplexor 410, multiplexor 420, and power multiplexor controller 430. Examples of power supplies 414 and 422 may include switched mode power supplies (SMPSs) associated with less widely-used, local power domains. Further in this example, power supply 412 is associated with a higher current than are power supplies 414, 422 because power supply 412 may be used to power both processing units 402, 404 during normal operations.

Consider an example use case in which it is desired to adjust a voltage of the CPU 402. For instance, it may be desirable to increase the voltage at the CPU 402 in order to increase the frequency of operation, or it may be desirable to reduce the voltage at CPU 402 in order to save power. In any event, such voltage changes may be facilitated by power supply 414 (local to CPU 402) in order to leave GPU 404 unaffected. In such an example, the CPU 402 may use the Select signal to cause power multiplexor controller 430 to assert or de-assert the appropriate one of En_1 or En_2 to cause power multiplexor 410 to conduct current from power supply 414 and turn off the branch associated with power supply 412. As CPU 402 receives its power from power supply 414, other processes may reduce or increase the voltage from power supply 414 accordingly.

In some instances, frequency and voltage changes are determined by an operating system kernel that is executed by CPU 402, although the scope of embodiments may include any functionality to provide frequency and voltage changes. Once the operating system kernel determines to change the frequency and voltage of the CPU 402 back to a normal frequency and voltage, the CPU 402 may then use the Select signal to cause power multiplexor controller 430 to assert or de-assert En_1 or En_2 as appropriate so that power multiplexor 410 conducts current from power supply 412 rather than from power supply 414.

A similar operation may be performed at GPU 404 with respect to power multiplexor 420. In other words, assuming that power supply 412 is an "always on" power supply, then voltage changes may be accomplished by power multiplexor controller 430 causing power multiplexor 420 to switch to power supply 422 and either raising or lowering the voltage at power supply 422 accordingly. Power multiplexor controller 430 may at a later time cause power multiplexor 420 to switch back to conducting current from power supply 412 to GPU 404.

The embodiment of FIG. 4 shows CPU 402 and GPU 404, though the scope of embodiments is not limited to any number of processing units nor to any number of components that may be individually voltage-controlled by a power multiplexor. Rather, the principles described with respect to FIGS. 1-4 may be scaled to include any number of power multiplexor controllers, any number of power multiplexors, power supplies, and processing units. Furthermore, while power multiplexors 410, 420 are shown as corresponding to individual processing units, the scope of embodiments is not limited to a level of abstraction at processing units. Rather, any power-consuming component, for which it may be desirable to select a power domain for that individual component, may be associated with a power multiplexor. And any number of power multiplexors may be used in a computing system to supply both reliable and flexible power to any component as appropriate.

Various embodiments may include one or more advantages over conventional systems. For instance, some conventional power multiplexors may use branches that may be turned on or off, wherein those branches have only a single transistor each. However, such conventional power multiplexors may fail to turn off a transistor completely, thereby allowing current to leak from a power supply when it is intended that another power supply is selected. By contrast, various embodiments described herein use multiple transistors in each branch, wherein transistors in each branch may be controlled by different voltages, thereby employing a higher voltage to turn a transistor off when a source/drain of that transistor may be exposed to a higher voltage. Therefore, such embodiments may reduce or eliminate current through transistors that are intended to be off.

Additionally, various embodiments may omit analog comparators and voltage generators, instead using the logic of the multiple transistors in each branch and the voltage level shifters to turn on or off a given branch in response to assertion or de-assertion of the control signal. Accordingly, such embodiments may be less complicated than some conventional power multiplexors and use less circuit space.

Figure 5:
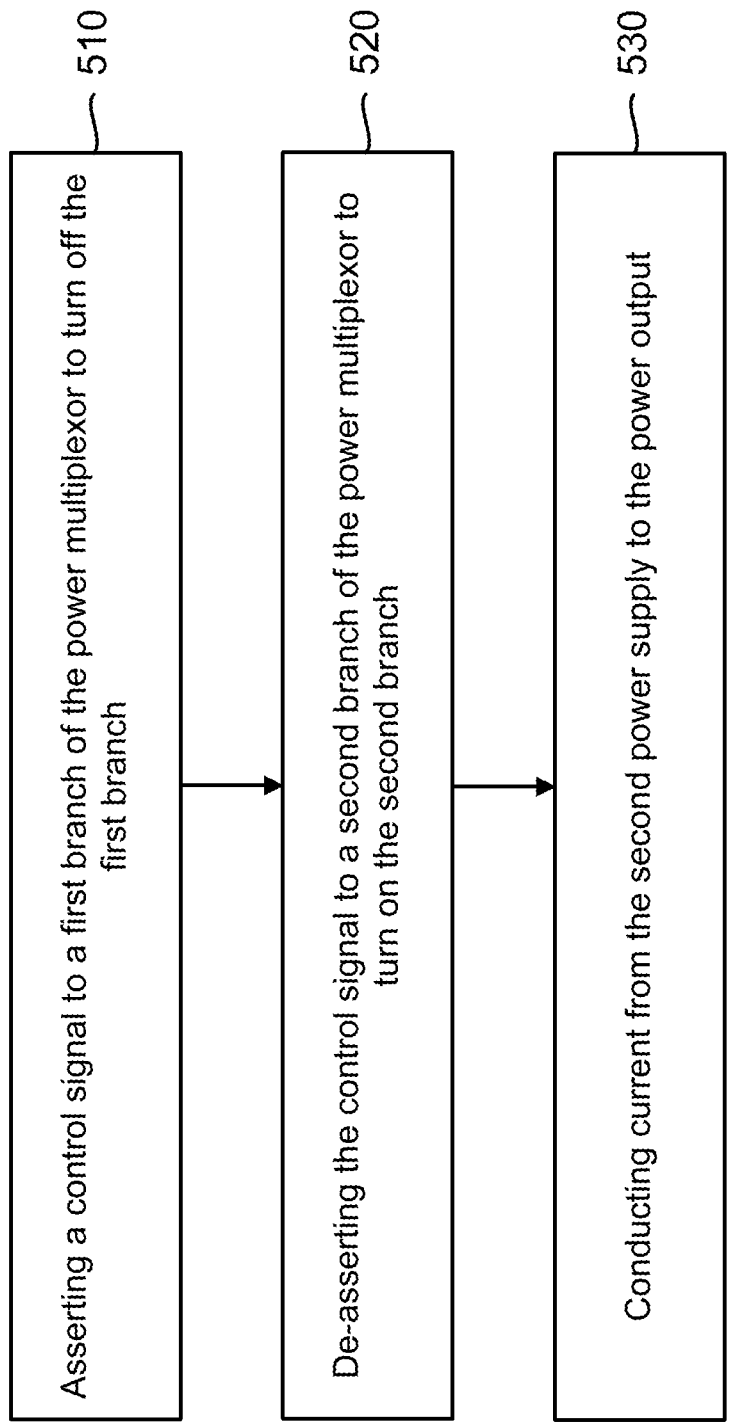
FIG. 5 is an illustration of an example method for power multiplexing, according to one embodiment.

A flow diagram of an example method 500 of multiplexing between multiple power supplies is illustrated in FIG. 5. In one example, method 500 is performed by a power management unit, which may include hardware and/or software functionality at a processor (e.g., CPU) of the computing device. In some examples, a power management unit includes processing circuitry that executes computer readable instructions to switch among multiple power supplies according to a particular algorithm. In some embodiments, the power management unit may include functionality provided by an operating system kernel or other utility in a GPU, CPU, or other processing unit. The functionality causes the GPU, CPU, or other processing unit to send signals to one or more power multiplexors to control those power multiplexors to switch among different power sources. Power multiplexor controllers receive those signals from the processing units and then assert or de-assert control signals accordingly.

At action 510, the power multiplexor controller asserts a control signal to the first branch of the power multiplexor to turn off the first branch. An example is shown at FIG. 3, wherein the first branch 101 includes a first PMOS transistor 111 and a second PMOS transistor 112 coupled between a first power supply VDD_AUX and a power output 120. In this example, the asserted control signal is applied to a gate of the first transistor 111 and applied to level shifter 132 at the gate of the second transistor 112.

In this example, asserting the control signal causes the first transistor and the second transistor to turn off. For instance, at action 510 the gate of the first transistor 111 is at a voltage (0.75 V) that is equal to or higher than a voltage associated with the first power supply VDD_AUX (0.75 V). Continuing with the example, the voltage level shifter 132 shifts the voltage of the control signal to a voltage that is associated with the second power supply VDD_DOM (0.95 V). Accordingly, the gate of the second transistor 112 is at a voltage that is equal to or higher than a voltage associated with the second power supply.

At action 520, the power multiplexor controller de-asserts the control signal to the second branch of the power multiplexor. Action 520 causes the second branch to turn on.

An example is shown at FIG. 3, wherein de-asserting the control signal includes applying a lower voltage level (e.g., 0 V) to the gates of the third and fourth PMOS transistors 113, 114. In the present example, the third and fourth transistors 113, 114 turn on when their gates are at a lower voltage than either their sources or their drains.

At action 530, the power multiplexor conducts current from the second power supply to the power output. In the example of FIG. 3, the second branch 102 conducts current from the second power supply VDD_DOM to the power output 120 when the second branch 102 is turned on.

The scope of embodiments is not limited to the specific method shown in FIG. 5. Other embodiments may add, omit, rearrange, or modify one or more actions. For instance, method 500 may further include turning the second branch off and turning the first branch on, thereby conducting current from the first power supply to the power output. Such example from FIG. 3 may include asserting the control signal at the second branch (En_2) so that a level shifted voltage is applied to the gate of the third transistor 113 and the voltage of the control signal is applied to the gate of the fourth transistor 114. This turns transistors 113, 114 off and stops current from being conducted from the second power supply VDD_DOM to the power output 120.

With the second branch 102 being turned off, the first branch 101 may then be turned on. To turn the first branch 101 on, the power multiplexor controller may de-assert the enable signal (En_2), thereby causing a lower voltage such as 0 V to be applied to the first and second transistors 111, 112. The lower voltage at the gates of the transistors 111, 112 turns the transistors 111, 112 on so that current is conducted from the first power supply VDD_AUX to the power output 120. In this example, one branch is turned on and the other branch is turned off at any given time to avoid both branches being turned on at the same time and allowing current to leak from one power supply to the other.

Various embodiments may include switching between the first and second power supplies repeatedly during normal operation of the computing device. Furthermore, as noted above, other embodiments may include more than two power supplies for a given power multiplexor, and in such an example method 500 may include turning off each of the branches of the power multiplexor except for one branch associated with a selected power supply. Of course, different power supplies may be selected over the course of a time span by turning on a branch associated with a given selected power supply in turning off the other branches. Additionally, various embodiments may include multiple power multiplexors distributed among a variety of different components, wherein each of those different power multiplexors may conduct current from one power supply or another power supply according to method 500.

It should also be noted that method 500 may be associated with other actions, such as lowering or raising a voltage level of a particular power supply and lowering or raising a frequency of operation of the computing device. For instance, actions 510-530 describe selecting the second power supply, and in an embodiment in which the second power supply is a more flexible or local power supply, method 500 may further include raising or lowering a voltage level associated with that second power supply in order to save power or to overdrive the computing device. Of course, method 500 may further include switching back to a different power supply, such as an always-on power supply, once the power saving or overdriving operation is done.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A power multiplexor comprising:
a first branch including a first transistor coupled in series with a second transistor between a first power supply and a power output;
a second branch including a third transistor coupled in series with a fourth transistor between a second power supply and the power output;
a controller configured to selectively assert and de-assert a control signal to the first branch and the second branch;
a first voltage level shifter coupled between the second transistor and the controller; and
a second voltage level shifter coupled between the third transistor and the controller, wherein the first transistor is configured to receive the control signal from the controller at a voltage level of the first power supply, and wherein the first voltage level shifter is configured to increase a voltage of the control signal to a voltage level of the second power supply.

2. The power multiplexor of claim 1, wherein the first transistor, second transistor, third transistor, and fourth transistor each comprise a respective P-type metal oxide semiconductor (PMOS) transistor.

3. The power multiplexor of claim 1, wherein the voltage level of the second power supply is higher than the voltage level of the first power supply.

4. The power multiplexor of claim 1, wherein the fourth transistor is configured to receive the control signal from the controller at the voltage level of the first power supply, and wherein the second voltage level shifter is configured to increase the voltage of the control signal to the voltage level of the second power supply.

5. The power multiplexor of claim 1, wherein the controller is configured to turn off the first transistor and the second transistor by asserting the control signal to the first branch and configured to turn on the third transistor and fourth transistor by de-asserting the control signal to the second branch.

6. The power multiplexor of claim 1, further comprising:
a processing unit coupled to the power output and configured to receive power from the power multiplexor, wherein the processing unit is configured to provide a second control signal to the controller, further wherein the controller is configured to turn on either the first branch or the second branch in response to the second control signal.

7. The power multiplexor of claim 1, wherein the power multiplexor is implemented in a system on chip (SOC) and is configured to output either a first voltage associated with the first power supply or a second voltage associated with the second power supply to a processing unit in the SOC.

8. The power multiplexor of claim 1, wherein the controller is configured to receive power from the first power supply, and wherein the control signal is at the voltage level of the first power supply.

9. The power multiplexor of claim 8, wherein the first power supply comprises an always-on power supply.

10. A method comprising:
asserting a control signal to a first branch of a power multiplexor, the first branch including a first transistor and a second transistor coupled between a first power supply and a power output, wherein the control signal is applied to a gate of the first transistor and applied to a level shifter at a gate of the second transistor;
de-asserting the control signal to a second branch of the power multiplexor, the second branch including a third transistor and a fourth transistor coupled between a second power supply and the power output; and
conducting current from the second power supply to the power output after de-asserting the control signal to the second branch;
wherein asserting the control signal to the first branch comprises: shifting a voltage of the control signal to a voltage associated with the second power supply by the level shifter, and applying the voltage associated with the second power supply to the gate of the second transistor.

11. The method of claim 10, wherein asserting the control signal causes the first transistor and second transistor to turn off.

12. The method of claim 10, wherein de-asserting the control signal causes the third transistor and fourth transistor to turn on, thereby creating a current path from the second power supply to the power output.

13. The method of claim 10, wherein the gate of the first transistor is at a voltage that is equal to or higher than a voltage associated with the first power supply;
wherein the gate of the second transistor is at a voltage that is equal to or higher than a voltage associated with the second power supply; and
wherein the first transistor and second transistor are off.

14. A digital power multiplexor comprising:
means for conducting current from a first power supply, the means for conducting current from the first power supply including a first transistor and a second transistor coupled in series between the first power supply and a power output;
means for conducting current from a second power supply, the means for conducting current from the second power supply including a third transistor and a fourth transistor coupled in series between the second power supply and the power output; and
means for selecting either the first power supply or the second power supply at a given time and not selecting the other of the first power supply or the second power supply at the given time, the means for selecting including control signal outputs to the first and fourth transistors and control signal outputs to voltage level shifters at the second and third transistors, wherein the first transistor is configured to receive a control signal from the selecting means at a voltage level of the first power supply, and wherein a first voltage level shifter coupled to the second transistor is configured to increase a voltage of the control signal to a voltage level associated with the second power supply.

15. The digital power multiplexor of claim 14, wherein the first transistor, second transistor, third transistor, and fourth transistor comprise respective P-type metal oxide semiconductor (PMOS) transistors.

16. The digital power multiplexor of claim 14, wherein the means for selecting comprises means for generating the control signal having a voltage corresponding to the voltage level of the first power supply.

17. The digital power multiplexor of claim 14, wherein the means for selecting is configured to receive power from the first power supply.

18. The digital power multiplexor of claim 17, wherein the first power supply comprises an always-on power supply.

* * * * *